United States Patent [19]

Murotani

[11] 4,393,477

[45] Jul. 12, 1983

[54] TEMPERATURE RESPONSIVE REFRESH CONTROL CIRCUIT

[75] Inventor: Tatsunori Murotani, Tokyo, Japan

[73] Assignee: Nippon Electric Co., Ltd., Tokyo, Japan

[21] Appl. No.: 215,465

[22] Filed: Dec. 11, 1980

[30] Foreign Application Priority Data

Dec. 11, 1979 [JP] Japan .............................. 54-160554

[51] Int. Cl.³ .................. G11C 7/00; H03K 3/282
[52] U.S. Cl. .................................. 365/222; 331/111
[58] Field of Search ............... 365/211, 212, 222, 149, 365/183; 357/28.51; 331/108 R, 108 B, 108 C, 108 D, 111, 57

[56] References Cited

U.S. PATENT DOCUMENTS 3,851,316 11/1974 Kodama .............................. 365/222

FOREIGN PATENT DOCUMENTS 54-4532 1/1979 Japan .................................. 365/222

OTHER PUBLICATIONS

Young, "Uncompromising 4-K Static RAM Runs Fast on Little Power," *Electronics*, May 12, 1977, pp. 99-103.

*Primary Examiner*—John C. Martin
*Attorney, Agent, or Firm*—Sughrue, Mion, Zinn, Macpeak and Seas

[57] ABSTRACT

A memory circuit provided with a temperature-compensated internal refresh function is disclosed. The memory circuit comprises an oscillator circuit having a frequency characteristic with a positive temperature coefficient and means for generating refresh signals on the basis of the oscillation period of the oscillator circuit, wherein refresh of the memory circuit is achieved with the refresh signals.

6 Claims, 7 Drawing Figures

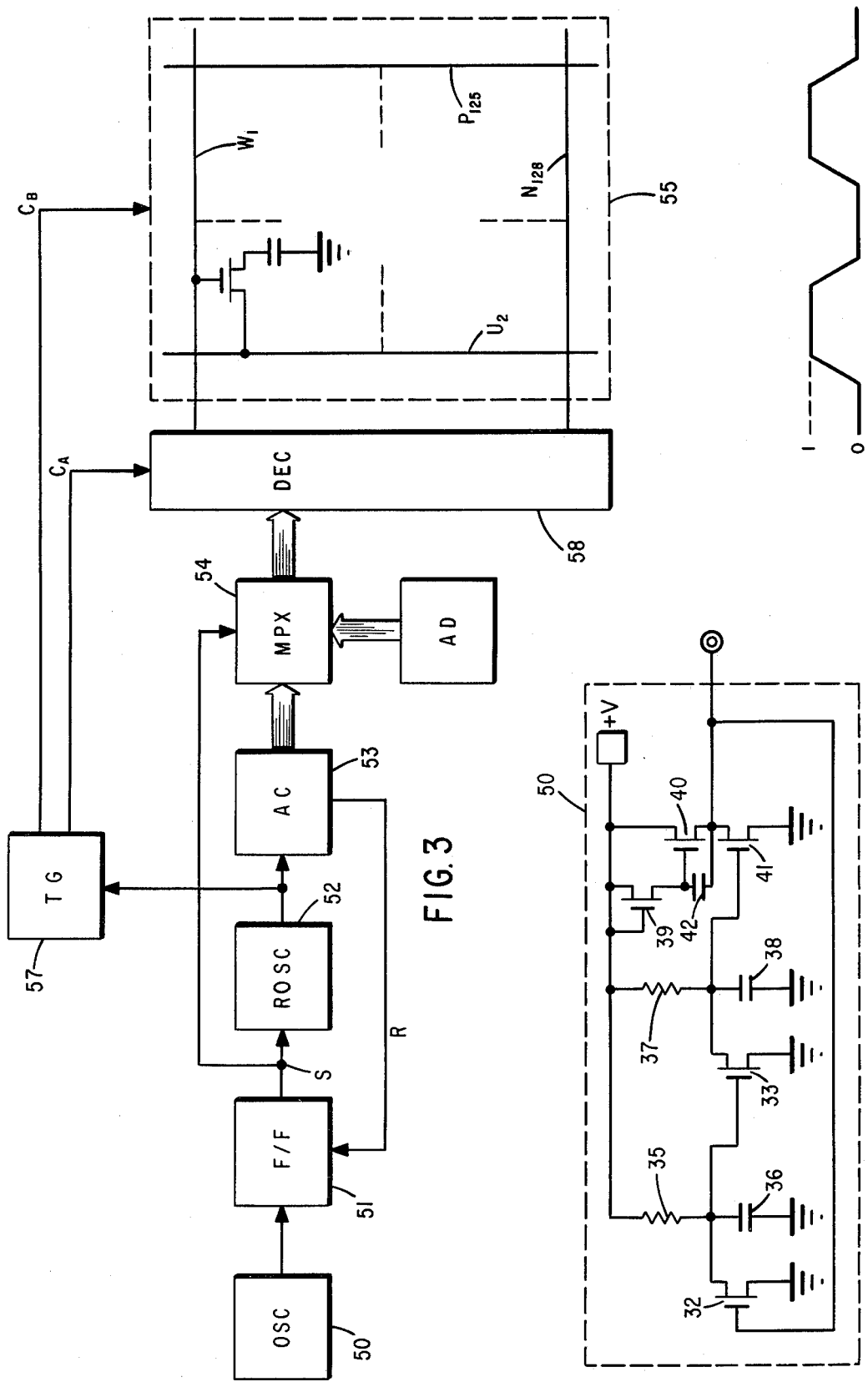

TEMPERATURE RESPONSIVE REFRESH CONTROL CIRCUIT

BACKGROUND OF THE INVENTION

The present invention relates to a dynamic memory circuit which requires refresh, and more particularly to a refresh control circuit therein.

Heretofore, dynamic random access memories in which each of the memory cells consists of a MOS FET as a transfer gate and a capacitor have been known as one of a number of popular semiconductor memory devices to be used in an information processing system such as an electronic computer or the like. In this dynamic memory, a stored information "1" or "0" is determined by existence or non-existence of electric charge stored in a capacitor. Such type of memories are fully described, for example, in U.S. Pat. No. 4,045,783. However, in this type of memory, it is necessary to maintain the stored information by recharging the capacitor by rewriting at predetermined time intervals because the charge stored in the capacitor is gradually discharged through a leakage path, e.g., between electrodes thereof. This rewriting is called a "refresh" operation, and the predetermined time interval is called a "refresh period" or "refresh time interval".

In general, the above-mentioned capacitors are formed integrally on a semiconductor substrate constructing a dynamic memory in such a manner that one region in the semiconductor substrate is used as one electrode of the capacitor, an insulator film formed on the substrate is used as a dielectric layer and a conductor layer deposited on the insulator film is used as the other electrode as indicated in U.S. Pat. No. 3,810,125. In this instance, the information stored in each memory cell is maintained in the form of electric charge retained at the boundaries of the dielectric layer and the respective electrodes.

However, this electric charge decreases gradually through a leakage path between the opposite electrodes of the capacitor. The rate of decrease is greatly enhanced as the environmental temperature rises, and accordingly, the refresh time interval must be shortened for compensating the electric charge lost through the leakage path. In prior art memory circuits, however, the refresh time interval has been set at a fixed value. It is to be noted that the shorter the refresh time interval is, the greater is the number of refreshes per unit time. Hence the period of in which the memory is externally accessible decreases, and thus the proportion of availability of the memory is decreased. Therefore the dynamic memory circuits in the prior art had a disadvantage that if the refresh time interval is set so as to meet the worst possible conditions of leakage, then the proportion of availability of the memory circuit is reduced to a minimum.

SUMMARY OF THE INVENTION

It is therefore one object of the present invention to provide a memory circuit in which the proportion of availability is greatly enhanced.

Another object of the present invention is to provide a dynamic memory in which the refresh of information can be achieved reliably.

Yet another object of the present invention is to provide a dynamic memory in which electric power consumption is reduced by controlling a refresh time interval in an optimum condition.

The memory circuit according to the present invention is featured by comprising an oscillator having a frequency characteristic of a positive temperature coefficient, that is, a characteristic in which an output frequency is increased as the environmental temperature rises, and means for generating a refresh command signal on the basis of the output of this oscillator.

The temperature coefficient of the oscillation frequency of the above-mentioned oscillator is preferably preset near the temperature coefficient of the conductance of the leakage path in the memory cell. Where a known RC-type oscillator is used as the mentioned oscillator, the resistor R is preferably formed of polycrystalline silicon having a negative temperature coefficient, especially of polycrystalline silicon whose specific resistance at 70° C. is reduced to one-tenth to one-hundredth of the specific resistance at 20° C.

According to one aspect of the present invention, there is provided a memory circuit comprising a memory cell array including a plurality of memory cells, each of the memory cells storing data in a dynamic manner, oscillator means for generating an oscillation signal having a frequency characteristic with a positive temperature coefficient, and refresh means responsive to the oscillator signal for operatively refreshing at least one of the memory cells.

According to another aspect of the present invention, there is also provided a memory circuit comprising a memory cell array including a plurality of dynamic type memory cells, address means for receiving external address signal, an oscillator circuit for generating an oscillation signal, a frequency value of the referred oscillation signal increasing substantially in proportion to a rise in temperature, a bistable circuit having first and second states, the bistable circuit taking the first state in response to the oscillation signal, internal address means responsive to the first state of the bistable circuit for generating an internal address signal, multiplex means coupled to the mentioned address means and the internal address means, access means coupled to the multiplex means for selectively making at least one of the memory cells in a readable condition, the multiplex means transferring the internal address signal and the external address signal to the access means in response to the first state and the second state of the bistable circuit respectively, and reset means responsive to the internal address means for setting the bistable circuit at the second state.

According to the present invention, it is possible to make the refresh time interval approximately near a maximum value so that effective utilization based on external address can be done without reducing the proportion of availability.

In case an RC-type oscillator circuit is employed as the mentioned oscillator circuit in the present invention, a resistor having a resistance of a negative temperature coefficient is effectively used to obtain the positive temperature coefficient frequency characteristic of the oscillator. A capacitor employing dielectric film having a positive temperature coefficient of dielectric constant may also be used for the above purpose.

BRIEF DESCRIPTION OF THE DRAWINGS

The above-mentioned and other features and objects of the present invention will become more apparent by reference to the following detailed description of the invention taken in conjunction with the accompanying drawings, wherein:

FIG. 3 is a block diagram showing a memory circuit according to one preferred embodiment of the present invention;

FIG. 5 is a more detailed circuit diagram of one example of the oscillator shown in FIG. 4;

FIG. 6 is a waveform diagram showing an output waveform of the RC-type oscillator shown in FIGS. 3 and 4.

DESCRIPTION OF THE PREFERRED EMBODIMENT

Figure 1:
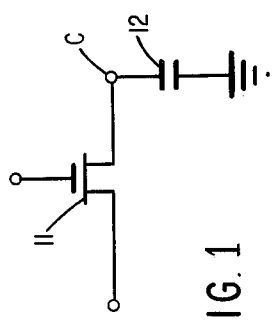
FIG. 1 is a circuit diagram of one memory cell in a dynamic memory.
Figure 2:
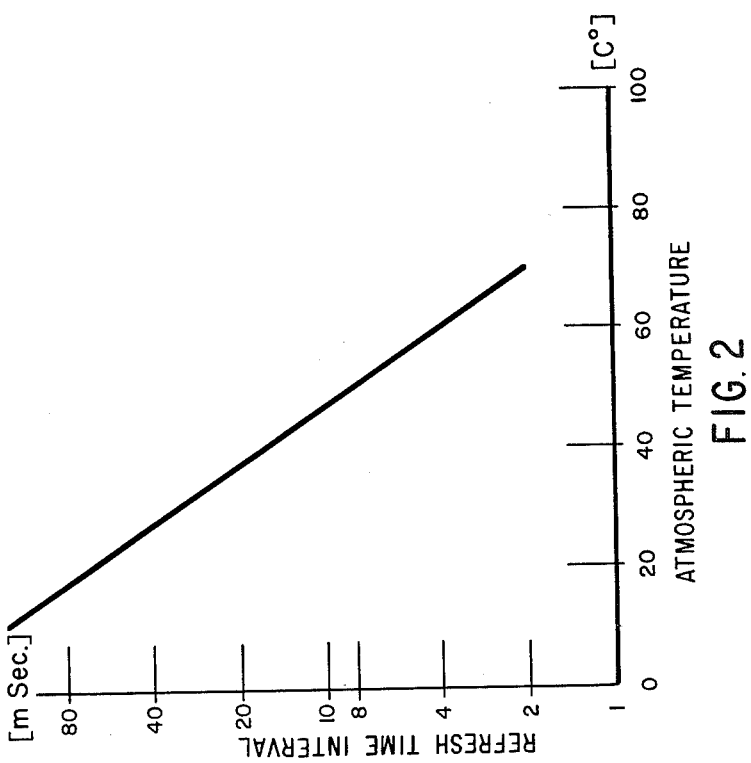
FIG. 2 is a diagram showing an optimum refresh time interval required in a dynamic memory as a function of an environmental temperature.

Referring now to FIG. 1, one memory cell in a representative dynamic memory is illustrated as constructed of a MOS FET 11 and a capacitor 12. In this instance, the MOS FET 11 is assumed to be of N-channel type. A junction point C between the MOS FET 11 and the capacitor 12 serves as a charge storing node, and between this node C and a semiconductor substrate (not shown) is formed a PN-junction. The charge stored at the node C would decrease due to a backward leakage current through the PN-junction, and this leakage current is greatly increased as the environmental temperature rises to a high level. Accordingly, a refresh time interval for recharging the lost electric charge must be greatly shortened in accordance with the temperature rise as shown in FIG. 2. For instance, when the environmental temperature rises from 20° C. to 70° C., the optimum refresh time interval is reduced from 64 msec to 2 msec. Thus, since the stored information will be lost if the refresh time interval is made larger than the optimum value that is determined depending upon the environmental temperature, in order to make a dynamic IC memory operate reliably in the temperature range of 20° C. to 70° C. the refresh time interval must be selected at the minimum value of 2 msec within this temperature range. Consequently, even at the moment when the environmental temperature is, in practice, so low that no problem would arise even if a longer refresh time interval is employed, the refresh cycles could frequently interrupt the normal read/write cycles based on an external command, resulting in degradation of the proportion of availability of the dynamic memory.

Now one preferred embodiment of the present invention will be described with reference to FIGS. 3 through 7.

One practical example of the refresh system employing a temperature-dependent oscillator according to the present invention is illustrated, in a block form, in FIG. 3. In this example, it is assumed that a 16K-bit dynamic memory having 128 refresh cycles with a cycle time of 200 n sec is employed. In other words, refresh of the entire memory is completed by repeating 128 refresh operations each having a cycle time of 200 n sec.

In FIG. 3, an oscillator 50 generates a series of pulses at an optimum refresh time interval within the range of, for example, 2 m sec to 40 m sec which depends upon the environmental temperature as shown in FIG. 2. Each output pulse from the oscillator 50 sets a flip-flop 51. In this embodiment, a cell array 55 is formed by 128 lines of word lines $W_1 \sim W_{128}$ and 125 lines of digit lines $D_1 \sim D_{125}$ in which memory cells as shown in FIG. 1 are disposed at respective intersections of the word lines and the digit lines. Time interval between respective refresh operations is determined by the oscillator circuit 50. A refresh oscillator 52 starts to generate a series of refresh control pulses at a cycle time of 200 n sec in response to a set state of the flip-flop circuit 51. An address counter 53 counts pulses from the refresh oscillator 52 and has a count capacity of 128 which corresponds to the number of the word lines in the cell array 55.

The memory cells coupled to one word lines are refreshed in response to a pulse from the refresh oscillator circuit within a cycle time of 200 n sec. The address counter 53 generates a reset signal R when it reaches full count, i.e. 128. Thus the address counter 53 generates an address necessitated for each refresh on a respective word line each time it receives the pulse from the refresh oscillator 52. When the refresh operation consisting of 128 refresh cycles of 128 has been completed, it also generates a reset signal R for resetting the flip-flop 51.

Here, the content of the address counter 53 is fed to a word decoder circuit 58 through a multiplex circuit 54 during the set state of the flip-flop 51. At the same time, a control timing signal generator 57 produces control signals $C_A$ and $C_B$ in response to respective pulses from the oscillator 52. The signal $C_A$ is used to control the operation of the decoder while signal $C_B$ is used to control the operation such as precharge and enabling of the cell array in a known manner. Upon resetting of the flip-flop 51, the refresh oscillator 52 stops oscillation in response to disappearance of the output signal S from the flip-flop 51. The multiplexer 54 is switched so as to transfer an external address signal fed through an external address buffer circuit 56 to the decoder circuit 58. Thus, refresh operation for all the memory cells is performed based on the signal from the oscillator 50. In this embodiment, the most important feature resides in that the oscillating frequency of the oscillator defining refresh time interval increases in proportion to a rise in atmospheric temperature as detailed below.

As described above, each time the refresh flip-flop 51 is set by the oscillation pulse from the oscillator 50, the external address is disconnected from the decoder 58, while internal address signals are generated for 128 cycles by the oscillator 52, and then the refresh operation is automatically terminated. In other words, the output signal from the refresh flip-flop 51 is a signal representing that the dynamic memory is in a refresh phase, and the multiplexer 54 is controlled by this output signal from the refresh flip-flop 51 in such a manner that during the period when the output signal is generated, the memory cell array 55 may be addressed by the internal refresh address fed from the refresh counter 53 for a refresh operation, whereas during the period when the output signal is not generated, the memory cell array 55 may be addressed by the external address through the external address buffer circuit 56 for a read/write operation.

Figure 4:
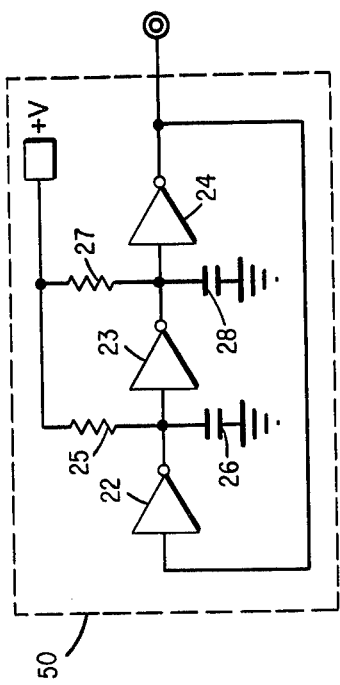
FIG. 4 is a circuit diagram of an oscillator used in the preferred embodiment shown in FIG. 3.

Now the structure of the oscillator 50 in FIG. 3 will be described with reference to FIG. 4. An oscillator 50 of astable multivibrator type is constructed of three inverters 22, 23 and 24 cascaded in series. The output end of the inverter 24 is connected to the input end of the inverter 22. The output of the first stage inverter 22 is connected to the input end of the inverter 23 in the next stage, and this junction point is connected to a voltage source +V through a polycrystalline silicon resistor 25 which is used as a temperature detector means, and is also connected to ground through a capacitor 26. Likewise, the output of the second stage inverter 23 is connected to the input end of the inverter 24 in the next stage, and this junction point is connected to the voltage source +V through a polycrystalline silicon resistor 27, and is also connected to ground through a capacitor 28. The output signal from the third stage inverter 24 is derived as an output from the oscillator 50 of astable multivibration type, which serves as a control signal for the refresh operation.

Figure 7:
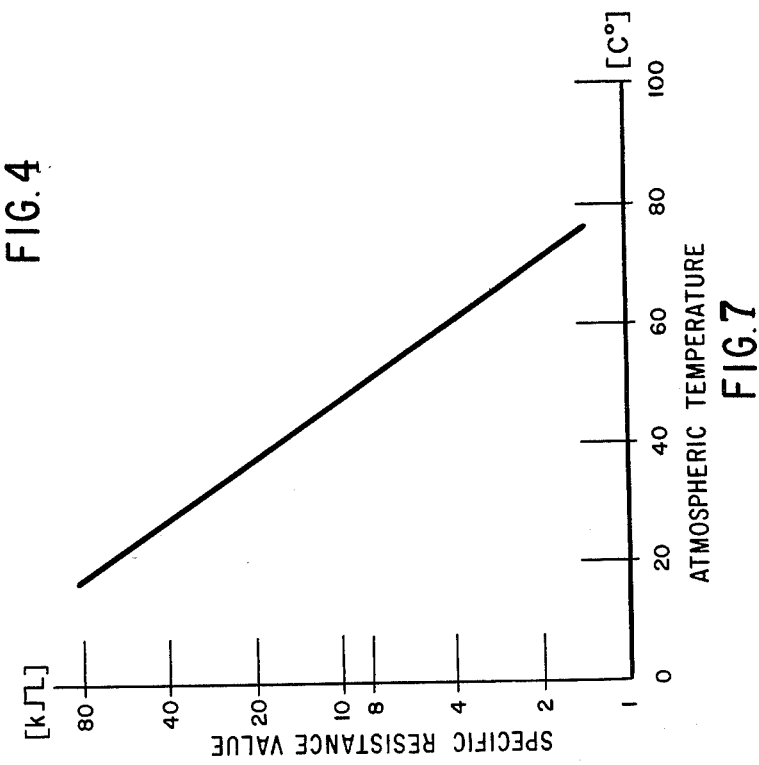
FIG. 7 is a diagram showing a resistance-temperature characteristic of a polycrystalline silicon resistor to be used in the preferred embodiment of the present invention shown in FIGS. 3 to 5.

The operation of the astable multivibrator 50 is as follows. This astable multivibrator 50 does not have a stable state because it consists of three stages of inverters, and thus it oscillates at an oscillation frequency which is determined by the time constant of the polycrystalline silicon resistors 25 and 27 and the capacitors 26 and 28 in combination. More particularly, when the capacitor 26 is in a discharged state, the output of the inverter 23 is at the "1" level. As the capacitor 26 is charged up through the polycrystalline silicon resistor 25, the voltage across the capacitor 26 is increased until it reaches a threshold voltage of the inverter 23 in the next stage, when the inverter 23 inverts and its output changes to the "0" level. The time constant for charging the capacitor 26 or 28, serves as a delay time of the inverter 23 or 24, and therefore, a rectangular wave signal as shown in FIG. 6 is generated at the output of the inverter 24. Since the resistance of the polycrystalline silicon resistor is lowered as the environmental temperature rises as shown in FIG. 7, the period of the output signal from the inverter 24 is shortened with the rise of the environmental temperature. Therefore, a dynamic memory in which refresh is effected at the maximum refresh time interval permissible for a given environmental temperature can be constructed by appropriately controlling the resistances of the polycrystalline silicon resistors 25 and 27 and the capacitances of the capacitors 26 and 28.

One example of a more detailed circuit arrangement of the oscillator 50 is illustrated in FIG. 5. MOS transistors 32 and 33 form the inverters 22 and 23, respectively, in FIG. 4 with their gates and drains connected as inputs and outputs, respectively. Resistors 35 and 37 and capacitors 36 and 38 correspond to the resistors 25 and 27 and the capacitors 26 and 28, respectively, in FIG. 4. MOS transistors 39, 40 and 41 and a capacitor 42 jointly form an inverter corresponding to the inverter 24 in FIG. 4. The MOS transistor 39 has a gate and a drain connected to a voltage source +V and a source connected to the gate of the MOS transistor 40 and one end of the bootstrap capacitor 42. In addition, the drain of the MOS transistor 40 is connected to the +V voltage source, and its source is connected to the other end of the capacitor 42 and the drain of the MOS transistor 41. In this way, an inverter is constructed with the gate of the MOS transistor 41 used as an input and its drain used as an output.

As described in detail above, according to the present invention, the environmental temperature is detected by means of polycrystalline silicon resistors to generate a refresh control signal having the maximum refresh time interval permissible at the given environmental temperature, thus the refresh operation can be achieved effectively, and consequently, a dynamic memory having a high proportion of availability can be provided.

It is to be noted that resistor elements having a negative temperature coefficient but made of other material than polycrystalline silicon, could be employed. In essence, it is only necessary to construct the oscillator so as to have a frequency characteristic with a negative temperature coefficient.

I claim:

1. A memory circuit comprising a memory cell array including a plurality of memory cells, each of said memory cells storing data in a dynamic manner; an oscillator for generating an oscillation signal having a frequency characteristic with a positive temperature coefficient, said oscillator including a first terminal receiving a first potential, a second terminal receiving a second potential, an output terminal from which said oscillation signal is derived, first to third nodes, a first resistor made of polycrystalline silicon and coupled between said first terminal and said first node, a second resistor made of polycrystalline silicon and coupled between said first terminal and said second node, a first capacitor coupled between said first node and said second terminal, a second capacitor coupled between said second node and said second terminal, a first field effect transistor coupled beteen said first node and said second terminal and having a gate coupled to said third node, a second field effect transistor coupled between said second node and said second terminal and having a gate coupled to said first node, a third field effect transistor coupled between said third node and said second terminal and having a gate coupled to said second node, a fourth field effect transistor coupled between said first terminal and said third node, a third capacitor coupled between said third node and a gate of said fourth transistor, a fifth field effect transistor coupled between said first terminal and the gate of said fourth transistor and having a gate coupled to said first terminal, and means for connecting said third node to said output terminal; and refresh means responsive to said oscillation signal for operatively refreshing at least one of said memory cells.

2. The circuit according to claim 1, in which each of said memory cells includes a storage capacitor and a transfer field effect transistor connected in series with said storage capacitor.

3. The circuit according to claim 1, in which said memory cells are arrayed in rows and columns and each refresh operation is performed on the memory cells coupled to one of said rows.

4. A memory circuit comprising a plurality of memory cells of a dynamic type; oscillator means for generating a periodic signal, the frequency of said periodic signal increasing in accordance with an increase in atmospheric temperature, said oscillator means including a first terminal to which a first potential is applied, a second terminal to which a second potential is applied, a first series circuit of a resistor made of a polycrystalline silicon and a capacitor, means for connecting one end of said first series circuit to said first terminal, means for connecting the other end of said first series circuit to said second terminal, a second series circuit of a resistor made of a polycrystalline silicon and a capacitor, means for connecting one end of said second series circuit to said first terminal, means for connecting the other end of said second series circuit to said second terminal, a first inverter, means for connecting an output terminal of said first inverter to an intermediate junction of said first series circuit, a second inverter, means for connecting an output terminal of said second inverter to an intermediate junction of said second series circuit, means for connecting the intermediate junction of said first series circuit to an input terminal of said second inverter, a third inverter circuit of an input field effect transistor and a load circuit connected in series at an intermediate node, said load circuit having a first field effect transistor coupled between said first terminal and said intermediate node, a capacitor coupled between said intermediate node and a gate of said first transistor, and a second field effect transistor coupled between said first terminal and the gate of said first transistor and having a gate coupled to said first terminal, means for connecting said intermediate node to an input terminal of said first inverter, an output terminal from which said periodic signal is derived, and means for connecting said output terminal to said intermediate node; means for generating a refresh command signal based on said periodic signal; and refresh means for operatively refreshing at least one of said memory cells in response to said refresh command signal.

5. The circuit according to claim 4, in which said refresh means includes a flip-flop adapted to be set by said refresh command signal, and internal address means responsive to the set state of said flip-flop for sequentially generating internal address signals.

6. A memory circuit comprising a memory cell array including:
a plurality of dynamic type memory cells;
address means for receiving an external address signal;
an oscillator circuit for generating an oscillation signal, a frequency of said oscillation signal increasing substantially in proportion to a rise in a temperature, said oscillator circuit including a first terminal receiving a first potential, a second terminal receiving a second potential, an output terminal from which said oscillation signal is derived, first to third nodes, a first resistor made of polycrystalline silicon and coupled between said first terminal and said first node, a second resistor made of polycrystalline silicon and coupled between said first terminal and said second node, a first capacitor coupled between said first node and said second terminal, a second capacitor coupled between said second node and said second terminal, a first field effect transistor coupled between said first node and said second terminal and having a gate coupled to said third node, a second field effect transistor coupled between said second node and said second terminal and having a gate coupled to said first node, a third field effect transistor coupled between said third node and said second terminal and having a gate coupled to said second node, a fourth field effect transistor coupled between said first terminal and said third node, a third capacitor coupled between said third node and a gate of said fourth transistor, a fifth field effect transistor coupled between said first terminal and the gate of said fourth transistor and having a gate coupled to said first terminal and means for connecting said third node to said output terminal;
a bistable circuit having first and second states, said bistable circuit taking the first state in response to said oscillation signal;
internal address means responsive to the first state of said bistable circuit for generating an internal address signal;
multiplex means coupled to said address means and said internal address means;
access means coupled to said multiplex means for selectively making at least one of said memory cells in readable condition, said multiplex means transferring the internal address signal and the external address signal to said access means in response to the first state and the second state of said bistable circuit, respectively; and
reset means responsive to said internal address means for setting said bistable circuit in the second state.

* * * * *